(12) United States Patent
Chia

(10) Patent No.: US 8,421,431 B2
(45) Date of Patent: Apr. 16, 2013

(54) FREQUENCY JITTER CONTROLLER FOR POWER CONVERTER

(75) Inventor: Ju-Lin Chia, Hsinchu (TW)

(73) Assignee: Power Forest Technology Corporation, Hsinchu (TW)

( * ) Notice: Subject to any disclaimer, the term of this patent is extended or adjusted under 35 U.S.C. 154(b) by 212 days.

(21) Appl. No.: 12/831,278

(22) Filed: Jul. 7, 2010

(65) Prior Publication Data

US 2011/0285440 A1 Nov. 24, 2011

(30) Foreign Application Priority Data

May 21, 2010 (TW) .................................. 99116311 A

(51) Int. Cl.
*H02M 1/15* (2006.01)
*H03B 23/00* (2006.01)

(52) U.S. Cl.
USPC .................... 323/288; 363/21.12; 331/177 R; 327/134

(58) Field of Classification Search .................. 323/282, 323/284, 288; 363/21.04, 21.11, 21.12; 331/178, 331/177 R; 327/134
See application file for complete search history.

(56) References Cited

U.S. PATENT DOCUMENTS

| | | | |
|---|---|---|---|
| 6,236,195 B1 * | 5/2001 | Nagatomo | 323/303 |
| 6,873,214 B2 * | 3/2005 | Harwood | 331/17 |
| 7,098,709 B2 * | 8/2006 | Ido et al. | 327/156 |
| 7,504,897 B2 * | 3/2009 | Chava et al. | 331/78 |
| 7,701,305 B2 * | 4/2010 | Lin et al. | 331/143 |
| 7,843,278 B2 * | 11/2010 | Hsu | 331/78 |
| 8,049,571 B2 * | 11/2011 | Yeh et al. | 331/78 |
| 2007/0132440 A1 * | 6/2007 | Yang | 323/304 |
| 2008/0136395 A1 * | 6/2008 | Bennett | 323/288 |
| 2009/0302955 A1 | 12/2009 | Hsu | |
| 2010/0007390 A1 * | 1/2010 | Yeh | 327/158 |
| 2010/0237960 A1 | 9/2010 | Yeh et al. | |

OTHER PUBLICATIONS

"Office Action of Taiwan Counterpart Application", issued on Jan. 21, 2013, p1-p9, in which the listed references were cited.

* cited by examiner

*Primary Examiner* — Adolf Berhane
*Assistant Examiner* — Fred E Finch, III
(74) *Attorney, Agent, or Firm* — Jianq Chyun IP Office

(57) ABSTRACT

A frequency-jitter-controller for a power-converter is provided, and which includes a first and a second capacitance units, a first and a second charge-discharge control units, a comparing unit and a control unit. Both capacitance units are charged to a crossing-voltage during a charging phase and discharged to a reference voltage and a clamp voltage respectively during a discharging-phase in response to operations of both charge-discharge control units. The comparing unit outputs a pulse signal, compares voltages of both capacitance units during the charging phase, and compares the voltage of the first capacitance unit and the reference voltage during the discharging phase. The control unit generates a frequency jitter control signal according to the pulse signal to adjust a rising rate of the voltage on the second capacitance unit, so as to change a frequency of the pulse signal, and thus reduce EMI generated by switching switch-elements in the power-converter.

20 Claims, 7 Drawing Sheets

FREQUENCY JITTER CONTROLLER FOR POWER CONVERTER

CROSS-REFERENCE TO RELATED APPLICATION

This application claims the priority benefit of Taiwan application serial no. 99116311, filed on May 21, 2010. The entirety of the above-mentioned patent application is hereby incorporated by reference herein and made a part of specification.

BACKGROUND

1. Field of the Disclosure

The disclosure relates to a power converter, more particularly, to a power converter having a low electromagnetic interference (EMI).

2. Description of Related Art

A power converter is used for converting unregulated power into a regulated voltage or current. Generally, a control circuit in the power converter can generate a switch signal to regulate an output voltage or current of the power converter, so as to adjust and stabilize the power of the power converter. Wherein, a duty cycle of the switch signal is modulated according to the output of the power converter, and a switching frequency of the switch signal is generally self-determined in internal of the control circuit of the power converter. In recent developments, a lot of pulse width modulation (PWM) control circuits are developed for the power converter in order to save the power consumption.

The power converters can be divided into linear power converters and switching power converters according to different circuit structures thereof. Wherein, the circuit structure of the switching power converter is complicated compared to that of the linear power converter, and electromagnetic interference (EMI) thereof is relatively great, though the switching power converter has advantages of high conversion rate, low power consumption during an idle state, and lightweight. In overall, the switching power converter is better than the linear power converter, so that the switching power converter is popular in a current power converter market. However, the EMI generated by the switching power converter can cause a noise of the power supply to influence other electronic devices, and can also influence signal transmissions of the neighboring communication devices or radios and televisions due to an outgoing radiation.

A conventional method for reducing the EMI is to add an EMI filter at an input terminal of the power supply. The EMI filter is generally consisted of passive devices such as inductors, capacitors and resistors, etc., so as to implement a purpose of filtering the EMI. However, the greater the EMI is, the greater the required EMI filter is, so that not only a circuit cost is increased, but also the EMI filter cannot deal with the radiation of the EMI.

SUMMARY

The disclosure is directed to a frequency jitter controller for a power converter, which can reduce electromagnetic interference (EMI) generated by switching switch-elements in the power converter.

The disclosure provides a frequency jitter controller for a power converter, which includes a first and a second capacitance units, a first and a second charge-discharge control units, a comparing unit and a control unit. The first charge-discharge control unit is coupled to the first capacitance unit, and is used for charging the first capacitance unit to a crossing-voltage during a charging phase and discharging the first capacitance unit to a reference voltage during a discharging phase. The second charge-discharge control unit is coupled to the second capacitance unit, and is used for charging the second capacitance unit to the crossing-voltage during the charging phase and discharging the second capacitance unit to a clamp voltage during the discharging phase.

A first input terminal, a second input terminal and a third input terminal of the comparing unit are respectively coupled to the first capacitance unit, the second capacitance unit and the reference voltage, and an output terminal of the comparing unit outputs a pulse signal. The comparing unit compares voltages of the first capacitance unit and the second capacitance unit during the charging phase and compares the voltage of the first capacitance unit and the reference voltage during the discharging phase. Moreover, the control unit is coupled to the output terminal of the comparing unit, and is used for generating a frequency jitter control signal according to the pulse signal to adjust a rising rate of the voltage on the second capacitance unit, so as to change a frequency of the pulse signal.

In an exemplary embodiment of the disclosure, the first charge-discharge control unit includes a first current source, a first switch and a second switch. The first current source is coupled to an operating voltage. The first switch is coupled between the first current source and the first input terminal of the comparing unit, and a conducting state of the first switch is controlled by a first switch signal. The second switch is coupled between the first input terminal of the comparing unit and ground, and a conducting state of the second switch is controlled by a second switch signal.

In an exemplary embodiment of the disclosure, the second charge-discharge control unit includes a second current source, a third switch, a buffer unit and a fourth switch. The second current source is coupled to the operating voltage. The third switch is coupled between the second current source and the second input terminal of the comparing unit, and a conducting state of the third switch is controlled by a third switch signal. The buffer unit is coupled to the clamp voltage, and is used for buffering the clamp voltage. Moreover, the fourth switch is coupled between the second input terminal of the comparing unit and the buffer unit, and a conducting state of the fourth switch is controlled by a fourth switch signal.

In an exemplary embodiment of the disclosure, the buffer unit includes an operational amplifier. A positive input terminal of the operational amplifier is coupled to the clamp voltage, a negative input terminal of the operational amplifier is coupled to an output terminal of the operational amplifier, and the output terminal of the operational amplifier is coupled to the fourth switch.

In an exemplary embodiment of the disclosure, the frequency jitter controller of the power converter further includes a switching unit, which is coupled to the output terminal of the comparing unit, and is used for generating the first to the fourth switch signals according to the pulse signal, so as to control the conducting states of the first to the fourth switches.

In an exemplary embodiment of the disclosure, during the charging phase, the first and the third switches are in a turned-on state, and the second and the fourth switches are in a turned-off state. Moreover, during the discharging phase, the first and the third switches are in the turned-off state, and the second and the fourth switches are in the turned-on state.

In an exemplary embodiment of the disclosure, the first capacitance unit includes a first capacitor coupled between the first input terminal of the comparing unit and the ground.

In an exemplary embodiment of the disclosure, the second capacitance unit includes a fifth switch, a plurality of second capacitors, a plurality of sixth switches, a seventh switch, a plurality of third capacitors and a plurality of eighth switches. The fifth switch is coupled between the second input terminal of the comparing unit and a first node. The sixth switches respectively correspond to the second capacitors, and each of the second capacitors and the corresponding sixth switch thereof are connected in series between the first node and the ground, wherein the frequency jitter control signal controls conducting states of the fifth switch and the sixth switches, so as to change a capacitance of the second capacitance unit, and accordingly adjust the rising rate of the voltage on the second capacitance unit. The seventh switch is coupled between the second input terminal of the comparing unit and a second node. The eighth switches respectively correspond to the third capacitors, and each of the third capacitors and the corresponding eighth switch thereof are connected in series between the second node and the ground, wherein the frequency jitter control signal controls conducting states of the seventh switch and the eighth switches, so as to change the capacitance of the second capacitance unit, and accordingly adjust the rising rate of the voltage on the second capacitance unit.

In an exemplary embodiment of the disclosure, a voltage value of the crossing-voltage is decreased as the capacitance of the second capacitance unit is increased. Conversely, the voltage value of the crossing-voltage is increased as the capacitance of the second capacitance unit is decreased.

In an embodiment of the disclosure, the second capacitance unit includes a second capacitor coupled between the second input terminal of the comparing unit and the ground.

In an embodiment of the disclosure, the second charge-discharge control unit further includes a charging current auxiliary unit, which is connected in parallel to the second current source, and is controlled by the control unit to assist the second current source for charging the second capacitance unit, so as to adjust the rising rate of the voltage on the second capacitance unit.

In an embodiment of the invention, the charging current auxiliary unit includes a plurality of third current sources, a plurality of fifth switches, a sixth switch, a plurality of fourth current sources, a plurality of seventh switches and an eighth switch. Wherein, the fifth switches respectively correspond to the third current sources, and each of the third current sources and the corresponding fifth switch thereof are connected in series between the operating voltage and a first node. The sixth switch is coupled between the first node and the second current source, and the frequency jitter control signal controls conducting states of the fifth switches and the sixth switch, so as to change a charging current that the second charge-discharge control unit charges the second capacitance unit. The seventh switches respectively correspond to the fourth current sources, and each of the fourth current sources and the corresponding seventh switch thereof are connected in series between the operating voltage and a second node. The eighth switch is coupled between the second node and the second current source, and the frequency jitter control signal controls conducting states of the seventh switches and the eighth switch, so as to change the charging current that the second charge-discharge control unit charges the second capacitance unit.

In an embodiment of the invention, a voltage value of the crossing-voltage is increased as the charging current of the second capacitance unit is increased. Conversely, the voltage value of the crossing-voltage is decreased as the charging current of the second capacitance unit is decreased.

The disclosure provides a frequency jitter control method for a power converter. First, a first capacitance unit and a second capacitance unit are provided. Then, the first capacitance unit and the second capacitance unit are charged to a crossing-voltage during a charging phase, and voltages of the first capacitance unit and the second capacitance unit are compared. Then, the first capacitance unit and the second capacitance unit are respectively discharged to a reference voltage and a clamp voltage during a discharging phase, and the voltage of the first capacitance unit and the reference voltage are compared. Then, a pulse signal is generated according to comparison results during the charging phase and the discharging phase, so as to provide a frequency jitter control signal associated with the pulse signal. Finally, a rising rate of a voltage on the second capacitance unit is adjusted (by adjusting a charging current for charging the second capacitance unit or adjusting a capacitance of the second capacitance unit) according to the frequency jitter control signal, so as to change a time required for charging the first capacitance unit and the second capacitance unit to the crossing-voltage during the charging phase, and accordingly change a frequency of the pulse signal.

According to the above descriptions, the frequency jitter control signal output by the control unit of the frequency jitter controller is used to adjust the rising rate of the voltage on the second capacitance unit, so as to change a charging rate of the second capacitance unit, and accordingly advance or postpone a transition time of the pulse signal output by the comparing unit. In this way, the frequency of the pulse signal can be changed, so that a switching frequency can be spread in a relatively great bandwidth, so as to reduce the EMI generated by switching switch-elements in the power converter.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
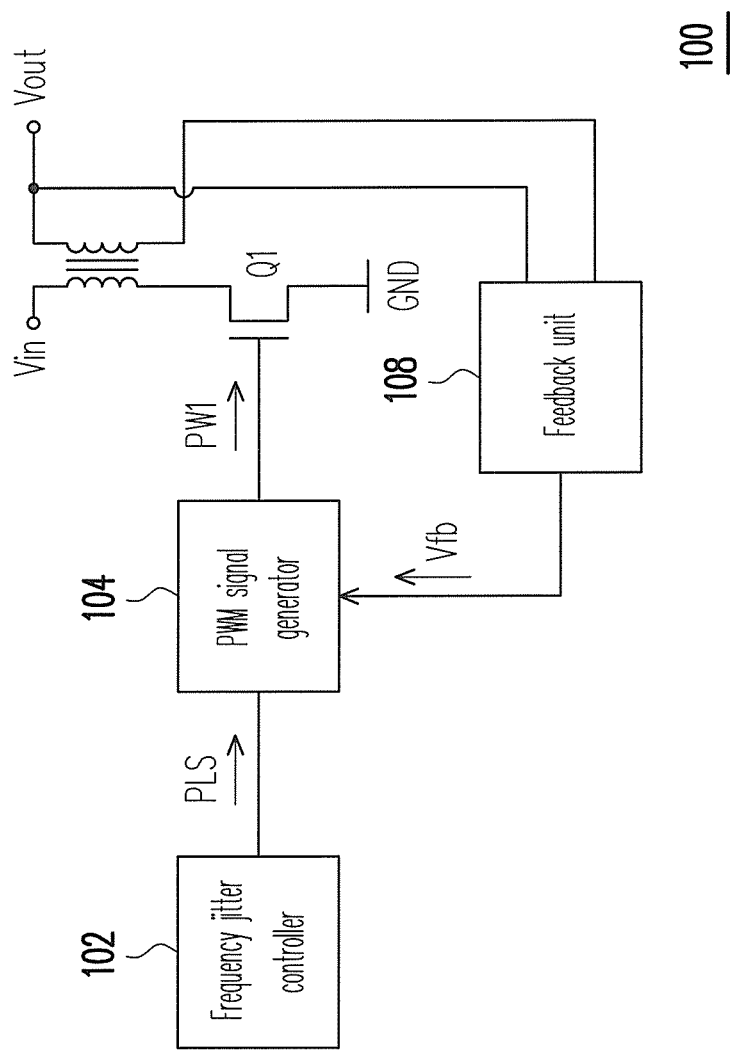
FIG. 1 is a schematic diagram illustrating a power converter according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

FIG. 1 is a schematic diagram illustrating a power converter according to an exemplary embodiment of the disclosure. Referring to FIG. 1, the power converter 100 is used for converting an unregulated power into a regulated voltage or current, for example, converting an input voltage Vin of FIG. 1 into a regulated output voltage Vout. The power converter 100 includes a frequency jitter controller 102, a pulse width modulation (PWM) signal generator 104, a transformer 106, a feedback unit 108 and a transistor Q1. Wherein, the PWM signal generator 104 is coupled between a gate of the transistor Q1 and the frequency jitter controller 102, the transistor Q1 is coupled between a primary side of the transformer 106 and the ground GND, and the feedback unit 108 is coupled between a secondary side of the transformer 106 and the PWM signal generator 104.

In the present exemplary embodiment, the transformer 106 receives the input voltage Vin through the primary side and outputs the regulated output voltage Vout through the secondary side. The PWM signal generator 104 outputs a PWM signal PW1 for turning on/off the transistor Q1, so as to control the current flowing through the primary side of the transformer 106, and accordingly adjust the output voltage Vout output by the secondary side of the transformer 106. The feedback unit 108 outputs a feedback signal Vfb to the PWM signal generator 104 according to the output voltage Vout of the power converter 100, so that the PWM signal generator 104 adjusts a duty cycle of the PWM signal PW1 according to the feedback signal Vfb, so as to determine a power transmitted from an input terminal of the power converter 100 to an output terminal of the power converter 100.

For example, when the output terminal of the power converter 100 is in a heavy loading state, the PWM signal generator 104 increases the duty cycle of the PWM signal PW1, and when the output terminal of the power converter 100 is in a light loading state, the PWM signal generator 104 decreases the duty cycle of the PWM signal PW1.

Moreover, the frequency jitter controller 102 is used for outputting a pulse signal PLS having a jitter frequency to the PWM signal generator 104, so as to change a frequency of the PWM signal PW1 generated by the PWM signal generator 104. In this way, a switching frequency of the transistor Q1 can be spread in a relatively great bandwidth, so as to reduce electromagnetic interference (EMI) generated by switching switch-elements (for example, the transistor Q1, though the disclosure is not limited thereto) in the power converter 100.

Figure 2:
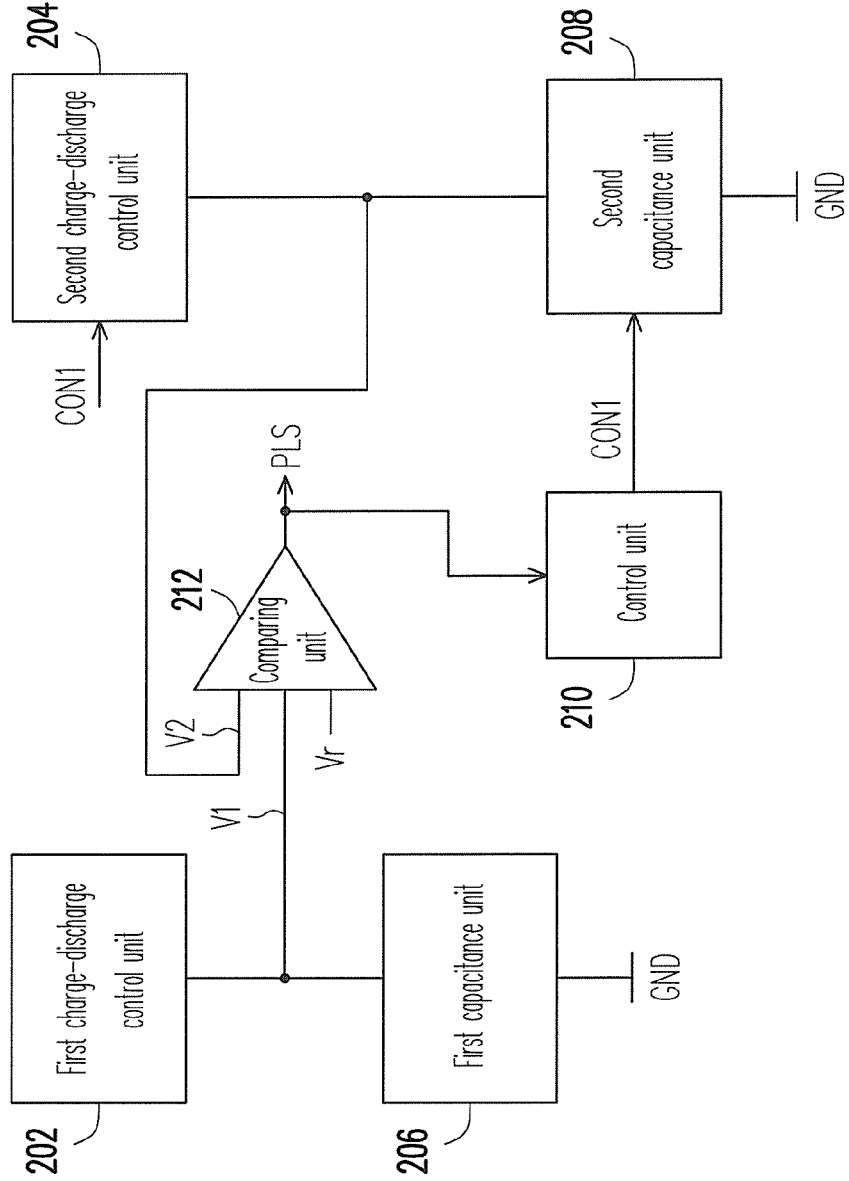
FIG. 2 is a schematic diagram illustrating a frequency jitter controller according to an exemplary embodiment of the disclosure.

In detail, a detail structure of the frequency jitter controller 102 of FIG. 1 is shown in FIG. 2. FIG. 2 is a schematic diagram illustrating the frequency jitter controller 102 according to an exemplary embodiment of the disclosure. Referring to FIG. 2, the frequency jitter controller 102 includes a first charge-discharge control unit 202, a second charge-discharge control unit 204, a first capacitance unit, 206, a second capacitance unit 208, a control unit 210 and a comparing unit 212. The first charge-discharge control unit 202 and the second charge-discharge control unit 204 are respectively coupled to the first capacitance unit 206 and the second capacitance unit 208. The first capacitance unit 206 is coupled between a first input terminal of the comparing unit 212 and the ground GND, and the second capacitance unit 208 is coupled between a second input terminal of the comparing unit 212 and the ground GND. A third input terminal of the comparing unit 212 is coupled to a reference voltage Vr.

Moreover, the control unit 210 is coupled between an output terminal of the comparing unit 212 and the second capacitance unit 208.

In the present exemplary embodiment, the first charge-discharge control unit 202 and the second charge-discharge control unit 204 are respectively used for charging or discharging the first capacitance unit 206 and the second capacitance unit 208. The control unit 210 is used for generating a frequency jitter control signal CON1 according to the pulse signal PLS output by the comparing unit 212, so as to adjust a rising rate (i.e. a slope) of a voltage on the second capacitance unit 208. The comparing unit 212 is used for comparing a first voltage V1 on the first capacitance unit 206, a second voltage V2 on the second capacitance unit 208 and the reference voltage Vr to output the pulse signal PLS.

Figure 3:
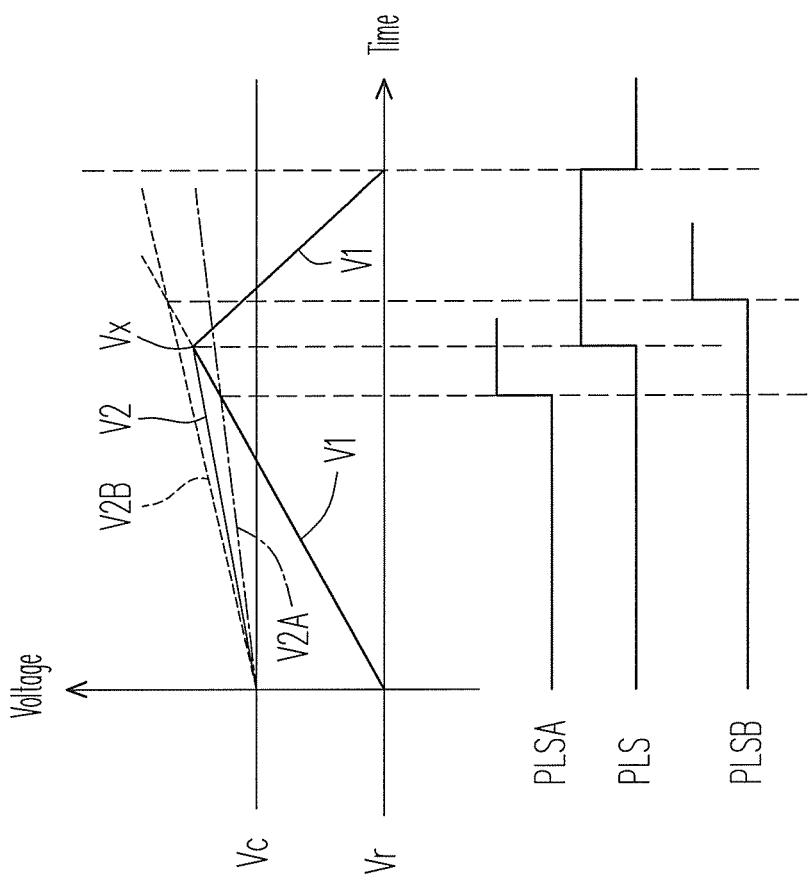
FIG. 3 is a waveform diagram of a first voltage, a second voltage and a pulse signal of FIG. 2.

FIG. 3 is a waveform diagram of the first voltage, the second voltage and the pulse signal of FIG. 2. Referring to FIG. 3, during a charging phase of the first capacitance unit 206 and the second capacitance unit 208, the first capacitance unit 206 and the second capacitance unit 208 are respectively charged (which is described in detail later) in response to operations of the first charge-discharge control unit 202 and the second charge-discharge control unit 204, so that voltage levels of the first voltage V1 and the second voltage V2 are continually increased. Wherein, voltage initial values of the first capacitance unit 206 and the second capacitance unit 208 are respectively the reference voltage Vr and a clamp voltage Vc. While the voltage levels of the first voltage V1 and the second voltage V2 are continually increased, the comparing unit 212 compares the voltage levels of the first voltage V1 and the second voltage V2 to output the pulse signal PLS. In the present exemplary embodiment, when the voltage level of the first voltage V1 is less than that of the second voltage V2, the pulse signal PLS output by the comparing unit 212 has a low voltage level.

Moreover, when the first voltage V1 and the second voltage V2 are increased to a same voltage level (i.e. a crossing-voltage Vx), the comparing unit 212 is changed to compare the voltage levels of the first voltage V1 and the reference voltage Vr, so that the pulse signal PLS output by the comparing unit 212 is changed to a high voltage level. Now, the first capacitance unit 206 and the second capacitance unit 208 enter a discharging phase, and are respectively discharged to the reference voltage Vr and the clamp voltage Vc (which are described in detail later) in response to the operations of the first charge-discharge control unit 202 and the second charge-discharge control unit 204.

In the present exemplary embodiment, when the voltage (i.e. the first voltage V1) on the first capacitance unit 206 is discharged to be less than the reference voltage Vr, the comparing unit 212 is changed to compare the first voltage V1 and the second voltage V2, so that the pulse signal PLS output by the comparing unit 212 is changed back to the low voltage level, and meanwhile the first capacitance unit 206 and the second capacitance unit 208 again enter the charging phase, and are again charged in response to the operations of the first charge-discharge control unit 202 and the second charge-discharge control unit 204.

As described above, a transition time point of a rising edge of the pulse signal PLS is a cross point (i.e. the crossing-voltage Vx) of rising curves of the first voltage V1 and the second voltage V2. Therefore, as long as a slope of the rising curve of the second voltage V2 is changed (i.e. the rising rate of the voltage on the second capacitance unit 208), a crossing time point of the rising curves of the first voltage V1 and the second voltage V2 can be advanced or postponed, i.e. the transition time point of the rising edge of the pulse signal PLS can be advanced or postponed.

For example, when the control unit 210 increases the capacitance of the second capacitance unit 208, the slope of the rising curve of the second voltage V2 is flattened (for example, a curve V2A in FIG. 3), so that the crossing time point of the rising curves of the first voltage V1 and the second voltage V2 is advanced, and now the pulse signal output by the comparing unit 212 is transited in advance to a pulse signal PLSA with a high voltage level. Similarly, when the control unit 210 decreases the capacitance of the second capacitance unit 208, the slope of the rising curve of the second voltage V2 is steepened (for example, a curve V2B in FIG. 3), so that the crossing time point of the rising curves of the first voltage V1 and the second voltage V2 is postponed, and now the pulse signal output by the comparing unit 212 is transited in postponement to a pulse signal PLSB with a high voltage level.

Figure 4:
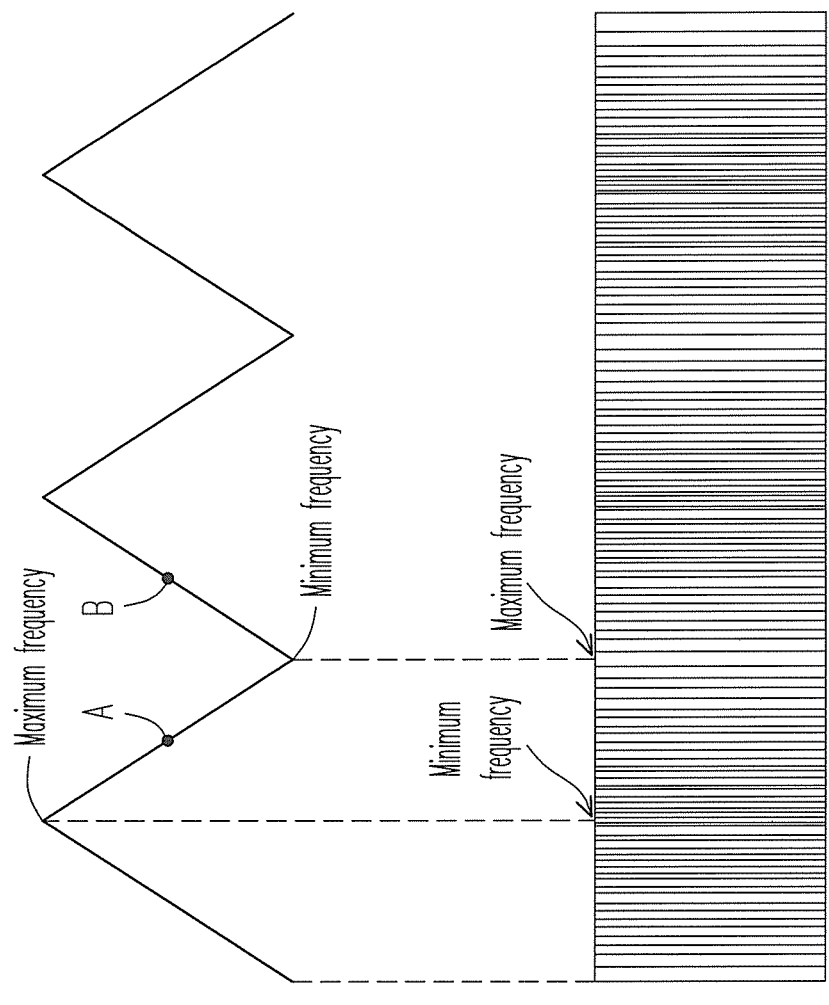
FIG. 4 is a schematic diagram of a second voltage and a pulse signal of FIG. 3 under a frequency domain.

On the other hand, FIG. 4 is a schematic diagram of the second voltage and the pulse signal of FIG. 3 under a frequency domain. Referring to FIG. 3 and FIG. 4, the smaller the capacitance of the second capacitance unit 208 is, the steeper the rising curve of the second voltage V2 in FIG. 2 is, the higher the frequency F2 of the second voltage V2 is, and the greater the voltage value at the crossing point of the rising curves of the first voltage V1 and the second voltage V2 of FIG. 3 is (i.e. the greater the crossing-voltage Vx is), so that a time required for increasing the second voltage V2 and the first voltage V1 to a same voltage level is prolonged. Therefore, the frequency of the pulse signal PLS output by the comparing unit 212 is reduced.

Conversely, the greater the capacitance of the second capacitance unit 208 is, the flatter the rising curve of the second voltage V2 in FIG. 2 is, the lower the frequency F2 of the second voltage V2 is, and the smaller the voltage value at the crossing point of the rising curves of the first voltage V1 and the second voltage V2 of FIG. 3 is (i.e. the smaller the crossing-voltage Vx is), so that a time required for increasing the second voltage V2 and the first voltage V1 to the same voltage level is shortened. Therefore, the frequency of the pulse signal PLS output by the comparing unit 212 is increased. Deduced by analogy, as long as the magnitude of the capacitance of the second capacitance unit 208 is constantly changed, the slope of the rising curve of the second voltage V2 is changed, so that the transition time of the pulse signal PLS can be advanced or postponed. In this way, the frequency of the pulse signal PLS can be changed, so as to achieve a spread spectrum effect, and accordingly mitigate the EMI generated by switching switch-elements in the power converter 100.

Figure 5:
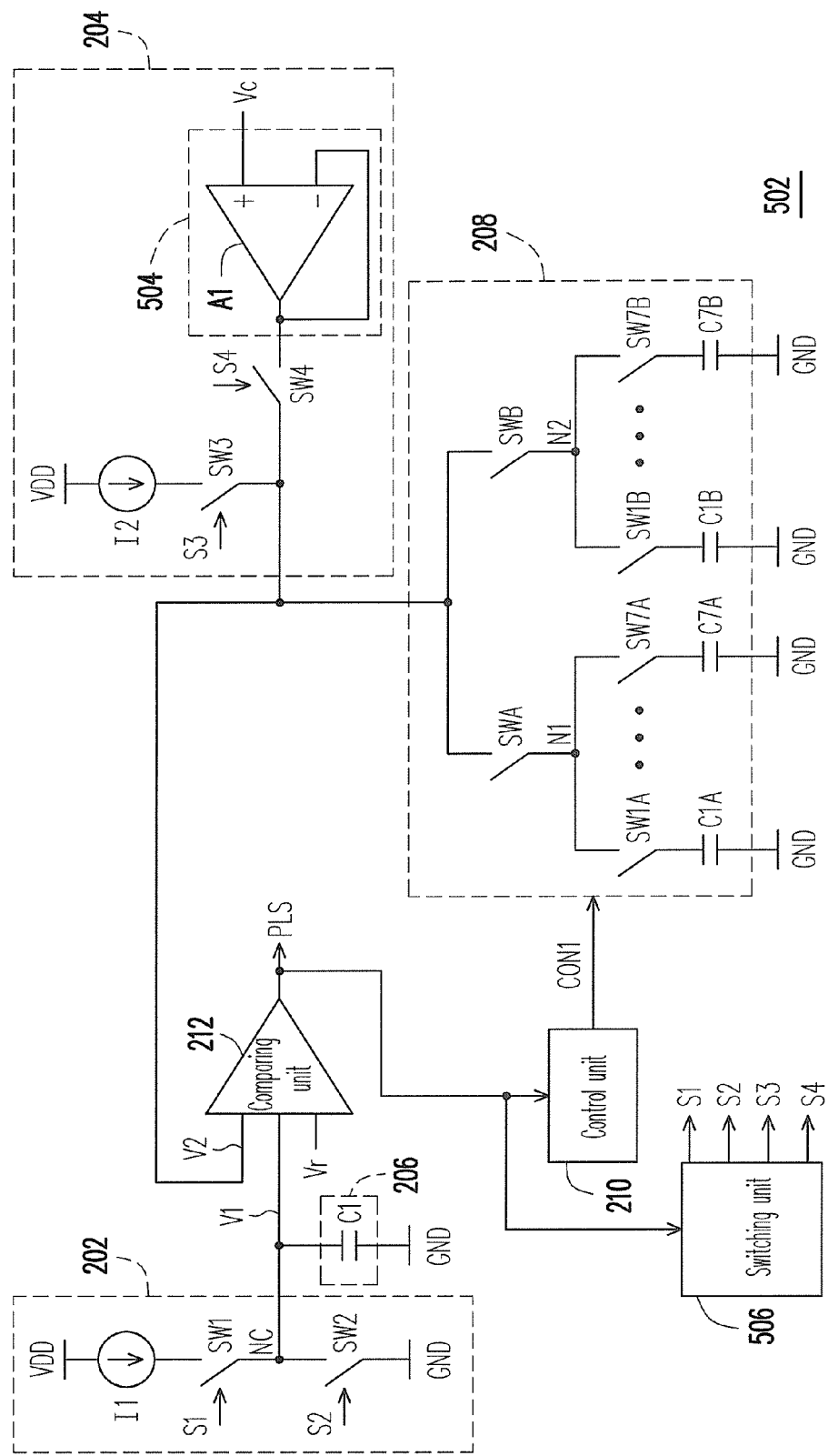
FIG. 5 is a schematic diagram illustrating a frequency jitter controller according to another exemplary embodiment of the disclosure.

Further, the frequency jitter controller 102 can be implemented by a circuit shown in FIG. 5. FIG. 5 is a schematic diagram illustrating a frequency jitter controller according to another exemplary embodiment of the disclosure. Referring to FIG. 5, in the present exemplary embodiment, the first charge-discharge control unit 202 includes switches SW1 and SW2, and a current source I1. The first capacitance unit 206 includes a capacitor C1. Wherein, the switches SW1 and SW2 and the current source I1 are connected in series between an operating voltage VDD and the ground GND, and a common node NC of the switches SW1 and SW2 is coupled to the first input terminal of the comparing unit 212. The capacitor C1 is coupled between the first input terminal of the comparing unit 212 and the ground GND.

The second charge-discharge control unit 204 includes a current source I2, switches SW3 and SW4, and a buffer unit 504. Wherein, the current source I2 and the switch SW3 are connected in series between the operating voltage VDD and the second input terminal of the comparing unit 212, and the switch SW4 and the buffer unit 504 are connected in series between the second input terminal of the comparing unit 212 and the clamp voltage Vc. The buffer unit 504 is used for buffering the clamp voltage Vc. In the present exemplary embodiment, the buffer unit 504 includes an operational amplifier A1, a positive input terminal (+) and a negative input terminal (−) of the operational amplifier A1 are respectively coupled to the clamp voltage Vc and an output terminal of the operational amplifier A1, and the output terminal of the operational amplifier A1 is coupled to the switch SW4.

Moreover, the frequency jitter controller 502 of the present exemplary embodiment further includes a switching unit 506 compared to the frequency jitter controller 102 of FIG. 2, the switching unit 506 is coupled to the output terminal of the comparing unit 212, and is used for generating first to the fourth switch signals S1-S4 according to the pulse signal PLS output by the comparing unit 212, so as to control the conducting states of the first to the fourth switches SW1-SW4. Preferably, the switch signals S1-S4 generated by the switching unit 506 do not simultaneously conducting the switches SW1 and SW2, and do not simultaneously conducting the switches SW3 and SW4, though the disclosure is not limited thereto, and in other exemplary embodiments, the switching unit 506 is not a necessary device/component. In other words, the switching unit 506 can be omitted. In this way, the switches SW1-SW4 can be switched according to an external switching mechanism.

On the other hand, the second capacitance unit 208 includes switches SWA, SWB, SW1A-SW7A, SW1B-SW7B, and capacitors C1A-C7A and C1B-C7B. Wherein, the switch SWA is coupled between the second input terminal of the comparing unit 212 and a first node N1, the switches SW1A-SW7A respectively correspond to the capacitors C1A-C7A (i.e. the switch SW1A corresponds to the capacitor C1A, the switch SW2A corresponds to the capacitor C2A, the others are deduced by analogy), and each of the capacitors C1A-C7A and the corresponding one of the switches SW1A-SW7A thereof are connected in series between the first node N1 and the ground GND. Similarly, the switch SWB is coupled between the second input terminal of the comparing unit 212 and a second node N2, the switches SW1B-SW7B respectively correspond to the capacitors C1B-C7B (i.e. the switch SW1B corresponds to the capacitor C1B, the switch SW2B corresponds to the capacitor C2B, the others are deduced by analogy), and each of the capacitors C1B-C7B and the corresponding one of the switches SW1B-SW7B thereof are connected in series between the second node N2 and the ground GND. In the present embodiment, conducting states of the switches SWA, SWB, SW1A-SW7A and SW1B-SW7B are controlled by the frequency jitter control signal CON1 generated by the control unit 210. In this way, the capacitance of the second capacitance unit 208 is changed, so as to adjust the rising rate of the voltage on the second capacitance unit 208.

In detail, during the charging phase of the first capacitance unit 206 and the second capacitance unit 208, the switches SW1 and SW3 are in a turned-on state, and the switches SW2 and SW4 are in a turned-off state, and now the operating voltage VDD can respectively charge the capacitor C1 and the capacitors in the second capacitance unit 208 through the current sources I1 and I2, so that the first voltage V1 and the second voltage V2 can be increased to a same voltage level (i.e. the crossing-voltage Vx) according to the curves shown in FIG. 3.

Moreover, during the discharging phase of the first capacitance unit 206 and the second capacitance unit 208, the switches SW2 and SW4 are in the turned-on state, and the switches SW1 and SW3 are in the turned-off state, and now the capacitor C1 is discharged to the ground GND through the switch SW2, so that the first voltage V1 is dropped to the reference voltage Vr according to the curve shown in FIG. 3. On the other hand, the capacitors in the second capacitance unit 208 can be discharged to the output terminal of the operational amplifier A1 through the switch SW4, so that the second voltage V2 is dropped to the clamp voltage Vc. When the first voltage V1 and the second voltage V2 are respectively dropped to the reference voltage Vr and the clamp voltage Vc, the conducting states of the switches SW1-SW4 return back to the conducting states as that in the charging phase, so as to carry on a next charging operation to the capacitors.

In the present exemplary embodiment, the capacitors C1A-C7A respectively have different capacitances (though the disclosure is not limited thereto), while the capacitances of the capacitors C1B-C7B are respectively equal to that of the capacitors C1A-C7A. Moreover, the frequency jitter control signal CON1 output by the control unit 210 controls the conducting states of the switches SWA, SWB, SW1A-SW7A and SW1B-SW7B, and conducting orders of the switches SW1A-SW7A and SW1B-SW7B.

For example, the frequency jitter control signal CON1 can be a bit signal used for controlling the conducting states of the switches SWB and SW1B-SW7B. Wherein, when a corresponding bit value of a switch is "1", the switch is in the turned-on state, and when a corresponding bit value of a switch is "0", the switch is in the turned-off state. Moreover, the conducting order of the switches SW1B-SW7B is determined by a bit value variation of the frequency jitter control signal CON1.

For example, assuming the capacitances of the capacitors C1B-C7B are sequentially arranged in a descending order, when the capacitance of the second capacitance unit 208 is required to be varied from a small value to a large value, the bit value of the frequency jitter control signal CON1 is varied in an ascending sequence (i.e. up counting) of "0000000"→"0000001"→"0000010"→ . . . →"1111111", though when the capacitance of the second capacitance unit 208 is required to be varied from a large value to a small value, the bit value of the frequency jitter control signal CON1 is varied in a descending sequence (i.e. down counting) of "1111111"→"1111110"→"1111101"→ . . . →"0000000". In this way, by controlling the up counting or down counting of the bit value of the frequency jitter control signal CON1, the corresponding switches SW1B-SW7B can be sequentially turned on or turned off, so as to increase or decrease the capacitance of the second capacitance unit 208. Similarly, the conducting states of the switches SWA and SW1A-SW7A can also be controlled according to the same way, so that detailed description thereof is not repeated.

An influence of the capacitance of the second capacitance unit 208 for the pulse signal PLS is described below. Referring to FIG. 4 and FIG. 5, when the switches SWA and SW1A-SW7A are in the turned-on state, and the switches SWB and SW1B-SW7B are in the turned-off state, the frequency F2 of the second voltage V2 in FIG. 4 falls to a half position (i.e. a point A) between a maximum frequency and a minimum frequency. Moreover, when the switch SWB is in the turned-on state under control of the frequency jitter control signal CON1, and the switches SW1B-SW7B coupled to the capacitors C1B-C7B are controlled by the frequency jitter control signal CON1 and are sequentially turned on, the capacitance of the second capacitance unit 208 is gradually increased, so that the frequency F2 of the second voltage V2 in FIG. 4 is gradually decreased. Moreover, when the switches SWB and SW1B-SW7B are all turned on, the frequency F2 of the second voltage V2 in FIG. 4 falls to a position corresponding to the minimum frequency. Now, the frequency of the corresponding pulse signal PLS has a maximum value.

Then, when the switches SW1B-SW7B are controlled by the frequency jitter control signal CON1 and are sequentially turned off, the capacitance of the second capacitance unit 208 is gradually decreased, so that the frequency F2 of the second voltage V2 in FIG. 4 is gradually increased. When the switches SWB and SW1B-SW7B are all turned off, the frequency F2 of the second voltage V2 in FIG. 4 is increased to a half position (i.e. a point B) between the maximum frequency and the minimum frequency. Then, to ensure the second voltage V2 reaching a higher frequency, the switches SW1A-SW7A are controlled by the frequency jitter control signal CON1 and are sequentially turned off, so that the capacitance of the second capacitance unit 208 is continually decreased. Therefore, the frequency F2 of the second voltage V2 in FIG. 4 can be continually increased.

When the switches SW1A-SW7A are all turned off, the frequency F2 of the second voltage V2 in FIG. 4 is increased to a position corresponding to the maximum frequency, and now the frequency of the corresponding pulse signal PLS has a minimum value. Deduced by analogy, by controlling the conducting states of the two sets of the switches (switches SWA and SW1A-SW7A and switches SWB and SW1B-SW7B) in the second capacitance unit 208, the capacitance of the second capacitance unit 208 can be changed, so as to change the frequency of the pulse signal PLS.

It should be noticed that in the present exemplary embodiment, although the switches SWA, SWB, SW1A-SW7A and SW1B-SW7B and the capacitors C1A-C7A and C1B-C7B are taken as an example for describing adjusting of the capacitance of the second capacitance unit 208, the disclosure is not limited thereto, and those skilled in the art can also use a different combination of the switches and capacitors, or can use other devices to adjust the capacitance of the second capacitance unit 208, so as to vary the curve of the second voltage V2 shown in FIG. 3, and accordingly change the frequency of the pulse signal PLS. In this way, the EMI generated by switching the switch-elements in the power converter 100 can be reduced.

Besides changing the capacitance of the second capacitance unit 208 to adjust the rising rate of the voltage on the second capacitance unit 208, in other exemplary embodiment of the disclosure, the rising rate of the voltage on the second capacitance unit 208 can also be adjusted by changing a charging current used for charging the second capacitance unit 208.

Figure 6:
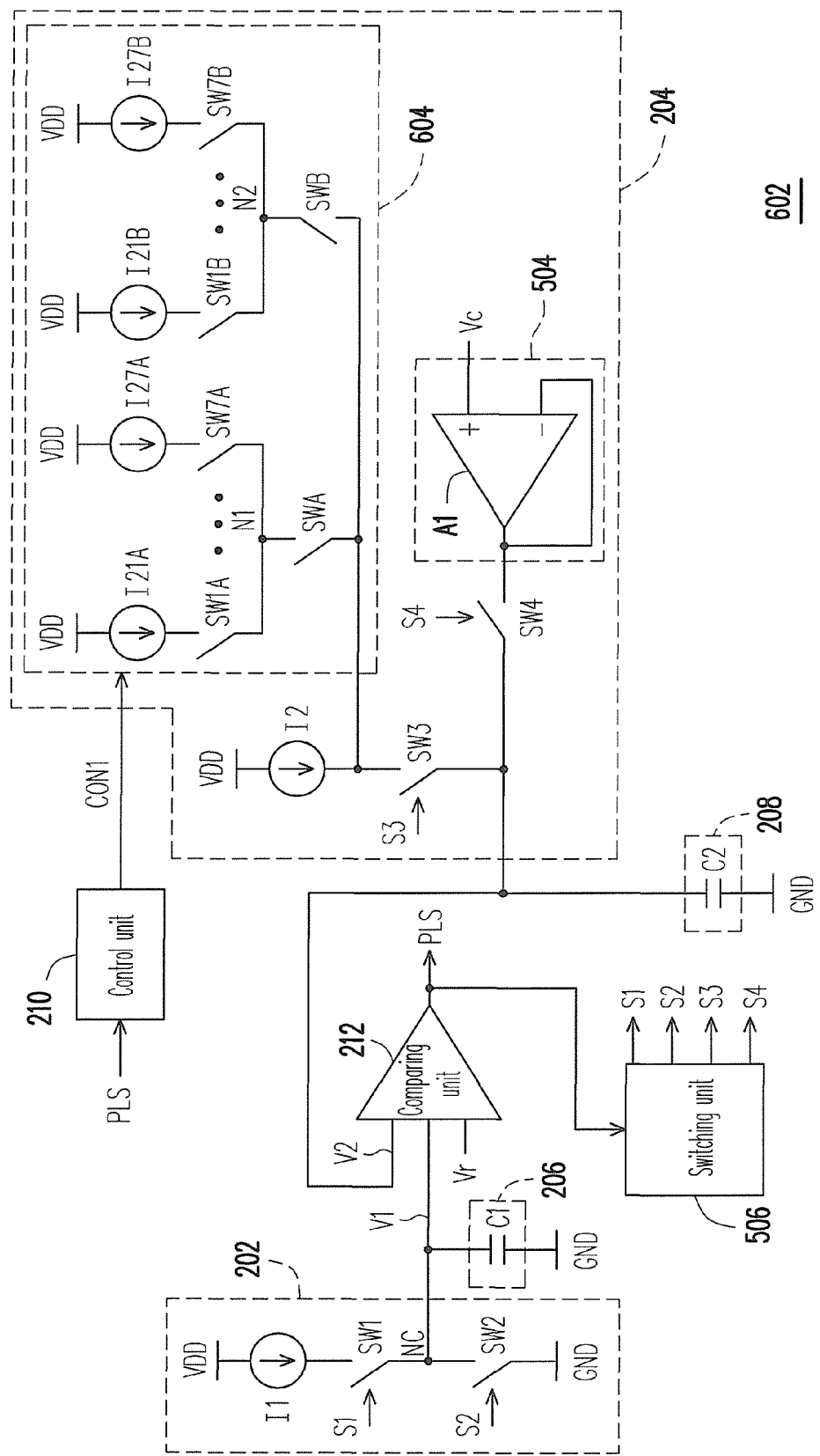
FIG. 6 is a schematic diagram illustrating a frequency jitter controller according to another exemplary embodiment of the disclosure.

In detail, FIG. 6 is a schematic diagram illustrating a frequency jitter controller according to another exemplary embodiment of the disclosure. Referring to FIG. 6, a difference between the frequency jitter controller 602 of the present exemplary embodiment and the frequency jitter controller 502 of FIG. 5 is that the second capacitance unit 208 of the frequency jitter controller 602 has only one capacitor C2, and a capacitance thereof can be determined according to an actual design requirement. Moreover, the second charge-discharge unit 204 of FIG. 6 further includes a charging current auxiliary unit 604, which is connected in parallel to the second current source I2, and is controlled by the control unit 210 to assist the second current source I2 for charging the second capacitance unit 208, so as to adjust the rising rate (i.e. the slope of the rising curve of the second voltage V2) of the voltage on the second capacitance unit 208.

In the present exemplary embodiment, the charging current auxiliary unit 604 includes current sources 121A-127A, current sources 121B-127B, switches SWA, SWB, SW1A-SW7A and SW1B-SW7B. Wherein, the switches SW1A-SW7A respectively correspond to the current sources 121A-127A, and each of the current sources 121A-127A and the corresponding one of the switches SW1A-SW7A thereof are connected in series between the operating voltage VDD and the first node N1. Moreover, the switch SWA is coupled between the first node N1 and the second current source I2. Similarly, the switches SW1B-SW7B respectively correspond to the current sources 121B-127B, and each of the current sources 121B-127B and the corresponding one of the switches SW1B-SW7B thereof are connected in series between the operating voltage VDD and the second node N2. Moreover, the switch SWB is coupled between the second node N2 and the second current source I2. In the present exemplary embodiment, the conducting states of the switches SWA, SWB, SW1A-SW7A and SW1B-SW7B are controlled by the frequency jitter control signal CON1 generated by the control unit 210. In this way, the charging current for the second charge-discharge control unit 204 charging the second capacitance unit 208 is changed, so as to adjust the rising rate of the voltage on the second capacitance unit 208.

It should be noticed that a controlling method of the conducting states of the switches SW1-SW4, SWA, SWB, SW1A-SW7A and SW1B-SW7B of the present exemplary embodiment is similar to the controlling method of the conducting states of the switches SWA, SWB, SW1A-SW7A and SW1B-SW7B of the embodiment of FIG. 5. However, a difference between the present exemplary embodiment and the embodiment of FIG. 5 is that in the embodiment of FIG. 5, the capacitance of the second capacitance unit 208 is changed by switching the conducting states of the switches SW1A-SW7A and SW1B-SW7B, so as to adjust the rising rate of the voltage on the second capacitance unit 208, though in the present exemplary embodiment, the charging current that the second charge-discharge control unit 204 charges the second capacitance unit 208 is changed by switching the conducting states of the switches SW1A-SW7A and SW1B-SW7B, so as to adjust the rising rate of the voltage on the second capacitance unit 208. Besides, the exemplary embodiment of FIG. 6 can still implement the technical effects similar to that of the embodiment of FIG. 5, and therefore detailed descriptions thereof are not repeated.

Figure 7:
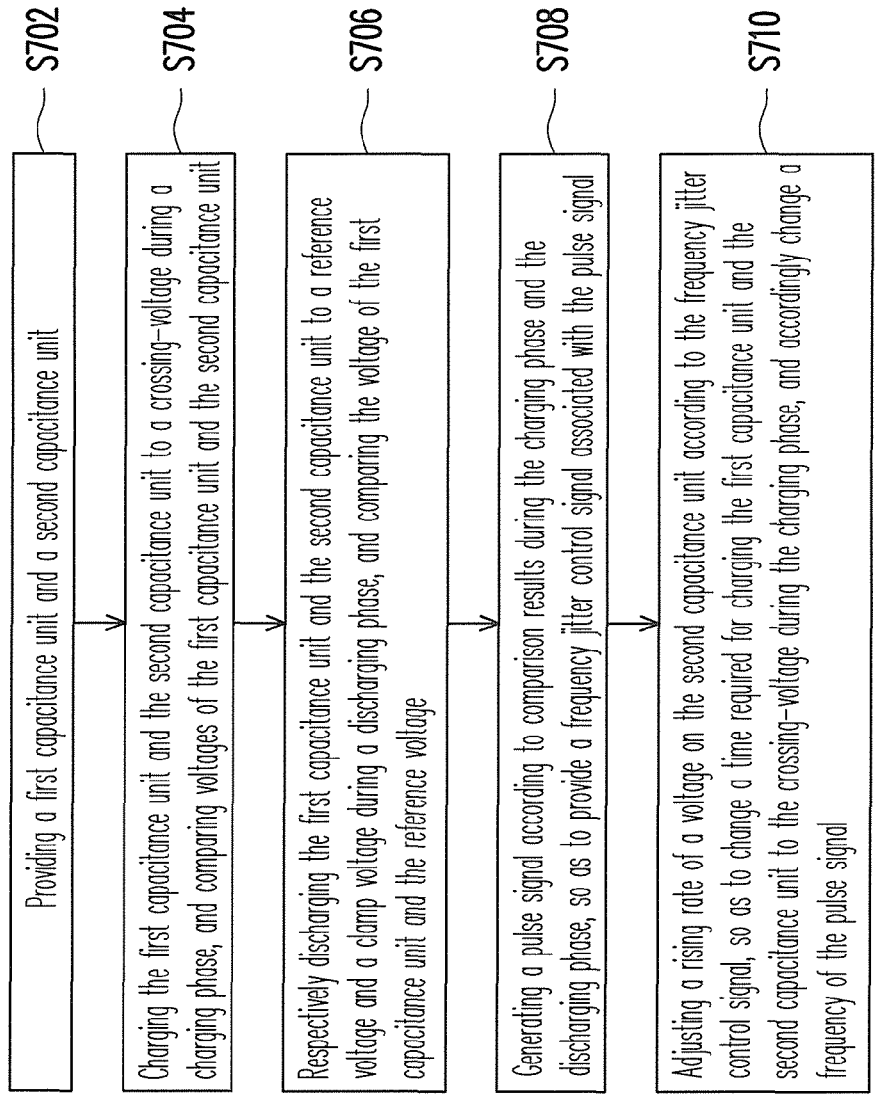
FIG. 7 is a flowchart illustrating a frequency jitter control method for a power converter according to an exemplary embodiment of the disclosure.

According to the above descriptions, a frequency jitter control method for a power converter is provided below, as that shown in FIG. 7. First, a first capacitance unit and a second capacitance unit are provided (step S702). Then, the first capacitance unit and the second capacitance unit are charged to a crossing-voltage during a charging phase, and voltages of the first capacitance unit and the second capacitance unit are compared (step S704). In the present exemplary embodiment, voltage initial values on the first capacitance unit and the second capacitance unit are respectively a reference voltage and a clamp voltage. Then, the first capacitance unit and the second capacitance unit are respectively discharged to the reference voltage and the clamp voltage during a discharging phase, and the voltage of the first capacitance unit and the reference voltage are compared (step S706).

Then, a pulse signal is generated according to comparison results during the charging phase and the discharging phase, so as to provide a frequency jitter control signal associated with the pulse signal (step S708). In the present exemplary embodiment, during the charging phase, when the voltage on the first capacitance unit is smaller than the voltage on the second capacitance unit, the generated pulse signal has a low voltage level, and during the discharging phase, the pulse signal is transited to have a high voltage level, until the voltage of the first capacitance unit is discharged to the reference voltage. Finally, a rising rate of the voltage on the second capacitance unit is adjusted according to the frequency jitter control signal, so as to change a time required for charging the first capacitance unit and the second capacitance unit to the crossing-voltage during the charging phase, and accordingly change a frequency of the pulse signal (step S710).

In the present exemplary embodiment, the method of adjusting the rising rate of the voltage on the second capacitance unit can be implemented by adjusting the capacitance of the second capacitance unit or adjusting the charging current used for charging the second capacitance unit. Wherein, if the rising rate of the voltage on the second capacitance unit is changed by adjusting the capacitance of the second capacitance unit, when the capacitance of the second capacitance unit is increased, the voltage value of the crossing-voltage and the frequency of the voltage on the second capacitance unit are decreased, so that the time required for charging the first capacitance unit and the second capacitance unit to the crossing-voltage is shortened, and the frequency of the pulse signal is accordingly increased. Conversely, when the capacitance of the second capacitance unit is decreased, the voltage value of the crossing-voltage and the frequency of the voltage on the second capacitance unit are increased, so that the time required for charging the first capacitance unit and the second capacitance unit to the crossing-voltage is prolonged, and the frequency of the pulse signal is accordingly decreased.

On the other hand, if the rising rate of the voltage on the second capacitance unit is changed by adjusting the charging current used for charging the second capacitance unit, when the charging current is increased, the voltage value of the crossing-voltage and the frequency of the voltage on the second capacitance unit are increased, so that the time required for charging the first capacitance unit and the second capacitance unit to the crossing-voltage is prolonged, and the frequency of the pulse signal is accordingly decreased. Conversely, when the charging current is decreased, the voltage value of the crossing-voltage and the frequency of the voltage on the second capacitance unit are decreased, so that the time required for charging the first capacitance unit and the second capacitance unit to the crossing-voltage is shortened, and the frequency of the pulse signal is accordingly increased.

Therefore, regardless of adjusting the capacitance of the second capacitance unit or adjusting the charging current used for charging the second capacitance unit, the frequency of the pulse signal can all be changed. Therefore, the EMI generated by switching the switch-elements in the power converter 100 can be reduced.

In summary, the frequency jitter control signal output by the control unit of the frequency jitter controller is used to adjust the rising rate of the voltage on the second capacitance unit, so as to advance or postpone a transition time of the pulse signal output by the comparing unit. In this way, the frequency of the pulse signal can be changed, so that the switching frequency can be spread in a relatively great bandwidth, so as to reduce the EMI generated by switching switch-elements in the power converter.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A frequency jitter controller for a power converter, comprising:
   a first capacitance unit;
   a second capacitance unit;
   a first charge-discharge control unit, coupled to the first capacitance unit, for charging the first capacitance unit to a crossing-voltage during a charging phase and discharging the first capacitance unit to a reference voltage during a discharging phase, wherein a maximum value of the crossing-voltage is associated with a rising rate of a voltage on the second capacitance unit;
   a second charge-discharge control unit, coupled to the second capacitance unit, for charging the second capacitance unit to the crossing-voltage during the charging phase and discharging the second capacitance unit to a clamp voltage during the discharging phase;
   a comparing unit, having a first input terminal, a second input terminal and a third input terminal respectively coupled to the first capacitance unit, the second capacitance unit and the reference voltage, and an output terminal outputting a pulse signal, wherein the comparing unit compares voltages of the first capacitance unit and the second capacitance unit during the charging phase and compares the voltage of the first capacitance unit and the reference voltage during the discharging phase; and
   a control unit, coupled to the output terminal of the comparing unit, for generating a frequency jitter control signal according to the pulse signal to adjust the rising rate of the voltage on the second capacitance unit, so as to change a frequency of the pulse signal.

2. The frequency jitter controller for the power converter as claimed in claim 1, wherein the first charge-discharge control unit comprises:
   a first current source, coupled to an operating voltage;
   a first switch, coupled between the first current source and the first input terminal of the comparing unit, wherein a conducting state of the first switch is controlled by a first switch signal; and
   a second switch, coupled between the first input terminal of the comparing unit and a ground, wherein a conducting state of the second switch is controlled by a second switch signal.

3. The frequency jitter controller for the power converter as claimed in claim 2, wherein the second charge-discharge control unit comprises:
   a second current source, coupled to the operating voltage;
   a third switch, coupled between the second current source and the second input terminal of the comparing unit, wherein a conducting state of the third switch is controlled by a third switch signal;
   a buffer unit, coupled to the clamp voltage, for buffering the clamp voltage; and
   a fourth switch, coupled between the second input terminal of the comparing unit and the buffer unit, wherein a conducting state of the fourth switch is controlled by a fourth switch signal.

4. The frequency jitter controller for the power converter as claimed in claim 3, wherein the buffer unit comprises:
   an operational amplifier, wherein a positive input terminal of the operational amplifier is coupled to the clamp voltage, a negative input terminal of the operational amplifier is coupled to an output terminal of the operational amplifier, and the output terminal of the operational amplifier is coupled to the fourth switch.

5. The frequency jitter controller for the power converter as claimed in claim 4, further comprising:
   a switch unit, coupled to the output terminal of the comparing unit, for generating the first to the fourth switch signals according to the pulse signal, so as to control the conducting states of the first to the fourth switches.

6. The frequency jitter controller for the power converter as claimed in claim 5, wherein
   during the charging phase, the first and the third switches are in a turned-on state, and the second and the fourth switches are in a turned-off state; and
   during the discharging phase, the first and the third switches are in the turned-off state, and the second and the fourth switches are in the turned-on state.

7. The frequency jitter controller for the power converter as claimed in claim 3, wherein the first capacitance unit comprises:
   a first capacitor, coupled between the first input terminal of the comparing unit and the ground.

8. The frequency jitter controller for the power converter as claimed in claim 7, wherein the second capacitance unit comprises:
   a fifth switch, coupled between the second input terminal of the comparing unit and a first node;
   a plurality of second capacitors;
   a plurality of sixth switches, respectively corresponding to the second capacitors, and each of the second capacitors and the corresponding sixth switch thereof being connected in series between the first node and the ground, wherein the frequency jitter control signal controls conducting states of the fifth switch and the sixth switches, so as to change a capacitance of the second capacitance unit, and accordingly adjust the rising rate of the voltage on the second capacitance unit;
   a seventh switch, coupled between the second input terminal of the comparing unit and a second node;
   a plurality of third capacitors; and
   a plurality of eighth switches, respectively corresponding to the third capacitors, and each of the third capacitors and the corresponding eighth switch thereof are connected in series between the second node and the ground, wherein the frequency jitter control signal controls conducting states of the seventh switch and the eighth switches, so as to change the capacitance of the second capacitance unit, and accordingly adjust the rising rate of the voltage on the second capacitance unit.

9. The frequency jitter controller for the power converter as claimed in claim 8, wherein a voltage value of the crossing-voltage is decreased as the capacitance of the second capacitance unit is increased, and the voltage value of the crossing-voltage is increased as the capacitance of the second capacitance unit is decreased.

10. The frequency jitter controller for the power converter as claimed in claim 7, wherein the second capacitance unit comprises:
    a second capacitor, coupled between the second input terminal of the comparing unit and the ground.

11. The frequency jitter controller for the power converter as claimed in claim 10, wherein the second charge-discharge control unit further comprises:
    a charging current auxiliary unit, connected in parallel to the second current source, and controlled by the control unit to assist the second current source for charging the second capacitance unit, so as to adjust the rising rate of the voltage on the second capacitance unit.

12. The frequency jitter controller for the power converter as claimed in claim 11, wherein the charging current auxiliary unit comprises:

a plurality of third current sources;

a plurality of fifth switches, respectively corresponding to the third current sources, and each of the third current sources and the corresponding fifth switch thereof being connected in series between the operating voltage and a first node;

a sixth switch, coupled between the first node and the second current source, and the frequency jitter control signal controlling conducting states of the fifth switches and the sixth switch, so as to change a charging current that the second charge-discharge control unit charges the second capacitance unit;

a plurality of fourth current sources;

a plurality of seventh switches, respectively corresponding to the fourth current sources, and each of the fourth current sources and the corresponding seventh switch thereof being connected in series between the operating voltage and a second node; and an eighth switch, coupled between the second node and the second current source, and the frequency jitter control signal controlling conducting states of the seventh switches and the eighth switch, so as to change the charging current that the second charge-discharge control unit charges the second capacitance unit.

13. The frequency jitter controller for the power converter as claimed in claim 12, wherein a voltage value of the crossing-voltage is increased as the charging current is increased, and the voltage value of the crossing-voltage is decreased as the charging current is decreased.

14. A frequency jitter control method for a power converter, comprising:

providing a first capacitance unit and a second capacitance unit;

charging the first capacitance unit and the second capacitance unit to a crossing-voltage during a charging phase, and comparing voltages of the first capacitance unit and the second capacitance unit, wherein a maximum value of the crossing-voltage is associated with a rising rate of a voltage on the second capacitance unit;

respectively discharging the first capacitance unit and the second capacitance unit to a reference voltage and a clamp voltage during a discharging phase, and comparing the voltage of the first capacitance unit and the reference voltage;

generating a pulse signal according to comparison results during the charging phase and the discharging phase, so as to provide a frequency jitter control signal associated with the pulse signal; and adjusting the rising rate of the voltage on the second capacitance unit according to the frequency jitter control signal, so as to change a time required for charging the first capacitance unit and the second capacitance unit to the crossing-voltage during the charging phase, and accordingly change a frequency of the pulse signal.

15. The frequency jitter control method for the power converter as claimed in claim 14, wherein the step of adjusting the rising rate of the voltage on the second capacitance unit comprises:

adjusting a charging current used for charging the second capacitance unit.

16. The frequency jitter control method for the power converter as claimed in claim 15, wherein a voltage value of the crossing-voltage and a frequency of the voltage on the second capacitance unit are increased as the charging current is increased, and a frequency of the pulse signal is decreased as the charging current is increased.

17. The frequency jitter control method for the power converter as claimed in claim 15, wherein a voltage value of the crossing-voltage and a frequency of the voltage on the second capacitance unit are decreased as the charging current is decreased, and a frequency of the pulse signal is increased as the charging current is decreased.

18. The frequency jitter control method for the power converter as claimed in claim 14, wherein the step of adjusting the rising rate of the voltage on the second capacitance unit comprises:

adjusting a capacitance of the second capacitance unit.

19. The frequency jitter control method for the power converter as claimed in claim 18, wherein a voltage value of the crossing-voltage and a frequency of the voltage on the second capacitance unit are decreased as the capacitance of the second capacitance unit is increased, and a frequency of the pulse signal is increased as the capacitance of the second capacitance unit is increased.

20. The frequency jitter control method for the power converter as claimed in claim 18, wherein a voltage value of the crossing-voltage and a frequency of the voltage on the second capacitance unit are increased as the capacitance of the second capacitance unit is decreased, and a frequency of the pulse signal is decreased as the capacitance of the second capacitance unit is decreased.

* * * * *